United States Patent
Satou et al.

(10) Patent No.: US 9,729,154 B2
(45) Date of Patent: Aug. 8, 2017

(54) RECONFIGURABLE LOGIC DEVICE CONFIGURED AS A LOGIC ELEMENT OR A CONNECTION ELEMENT

(71) Applicant: Taiyo Yuden Co., Ltd., Tokyo (JP)

(72) Inventors: Masayuki Satou, Tokyo (JP); Isao Shimizu, Saitama (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/022,197

(22) PCT Filed: Aug. 22, 2014

(86) PCT No.: PCT/JP2014/071958
§ 371 (c)(1),
(2) Date: May 31, 2016

(87) PCT Pub. No.: WO2015/037413
PCT Pub. Date: Mar. 19, 2015

(65) Prior Publication Data
US 2016/0277029 A1   Sep. 22, 2016

(30) Foreign Application Priority Data

Sep. 16, 2013   (JP) ................................ 2013-191234

(51) Int. Cl.
*H03K 19/177* (2006.01)
*H03K 19/0948* (2006.01)
(Continued)

(52) U.S. Cl.
CPC .......... *H03K 19/1776* (2013.01); *G11C 7/06* (2013.01); *G11C 8/10* (2013.01); *H03K 19/0948* (2013.01);
(Continued)

(58) Field of Classification Search
CPC ........... H03K 19/1776; H03K 19/0948; H03K 19/17728; H03K 19/17736; G11C 7/06; G11C 8/10
(Continued)

(56) References Cited

U.S. PATENT DOCUMENTS

| 5,761,483 | A | 6/1998 | Trimberger |
| 2009/0146686 | A1* | 6/2009 | Voogel ................ G06F 15/7867 326/38 |

(Continued)

FOREIGN PATENT DOCUMENTS

| JP | 2005-109960 A | 4/2005 |
| JP | 2008-278216 A | 11/2008 |
| JP | 2010-239325 A | 10/2010 |

OTHER PUBLICATIONS

International Preliminary report on patentability and Written Opinion received for PCT patent application No. PCT/JP2014/071958, issued on Mar. 22, 2016, 5 pages.

*Primary Examiner* — Dylan White
(74) *Attorney, Agent, or Firm* — Chip Law Group

(57) ABSTRACT

There is provided a logic device including memory cell units. Each of the memory cell units includes a pair of bit lines arranged corresponding to a column of memory cells, a word line, and an inverter unit connected to the pair of bit lines. The inverter unit includes a first CMOS and a second CMOS. The first CMOS is configured to receive an input signal from one of the pair of bit lines. The first CMOS includes a first MOS transistor and a second MOS transistor. The second CMOS is configured to receive an input signal from the other of the pair of bit lines. The second CMOS includes a third MOS transistor and a fourth MOS transistor. The inverter unit is configured to output a first differential signal and a second differential signal as a data signal.

16 Claims, 14 Drawing Sheets

(51) Int. Cl.
  *G11C 7/06* (2006.01)
  *G11C 8/10* (2006.01)
(52) U.S. Cl.
  CPC . *H03K 19/17728* (2013.01); *H03K 19/17736* (2013.01)
(58) Field of Classification Search
  USPC .............................................. 326/37–41, 47
  See application file for complete search history.

(56) References Cited

U.S. PATENT DOCUMENTS

2012/0007635 A1\* 1/2012 Hironaka ......... H03K 19/17728
  326/46
2012/0187979 A1 7/2012 Chandler \* cited by examiner

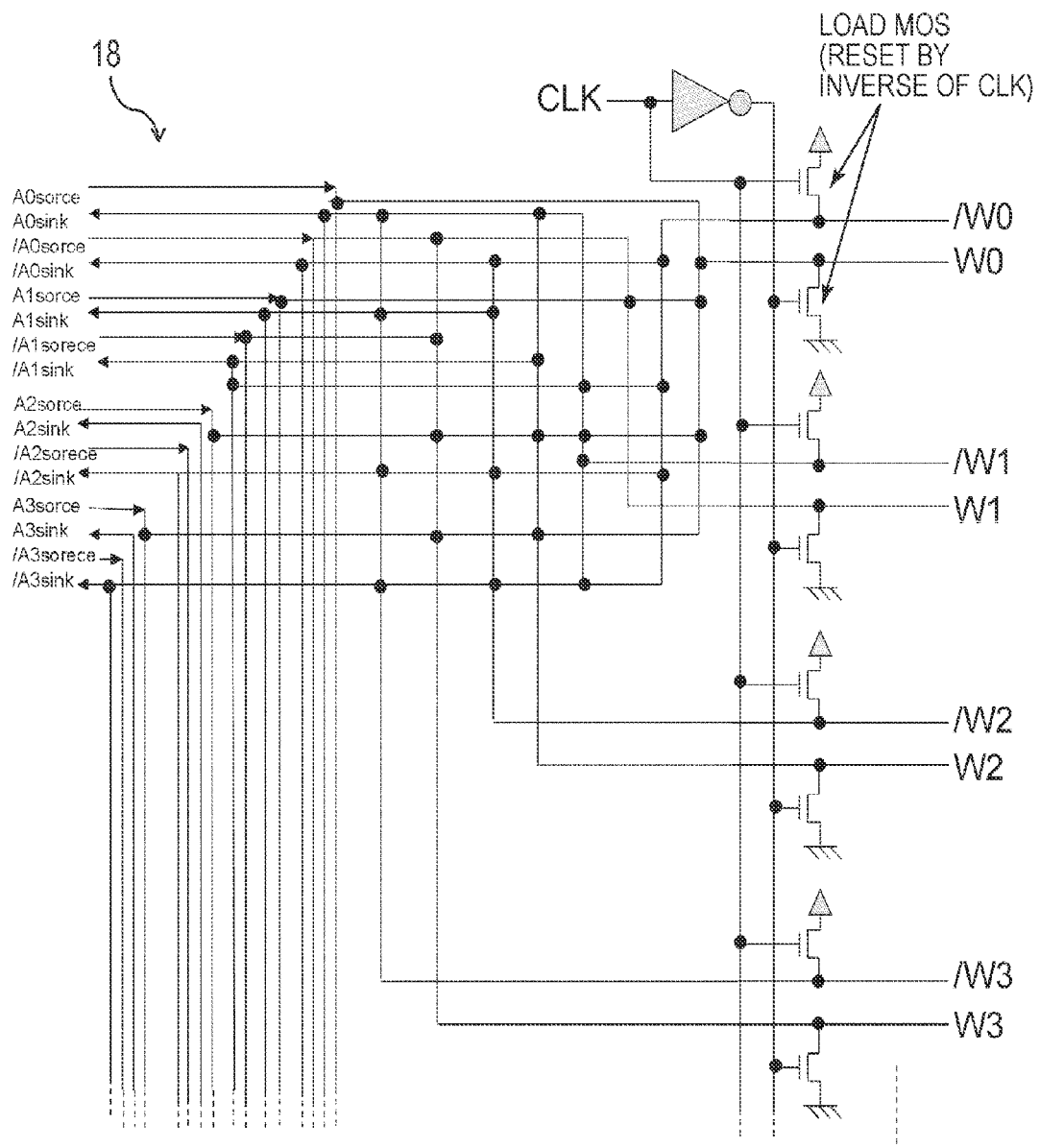

FIG. 10
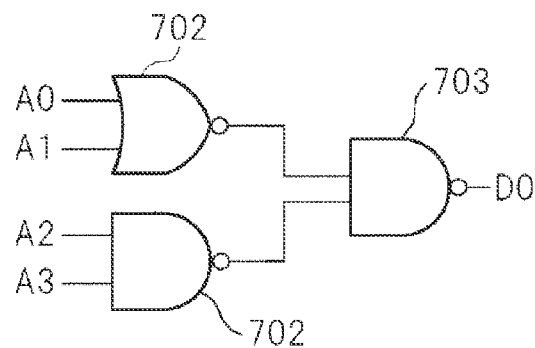
FIG. 11
| A0 | A1 | A2 | A3 | D0 | D1 | D2 | D3 |
|----|----|----|----|----|----|----|----|
| 0 | 0 | 0 | 0 | 0 | * | * | * |
| 1 | 0 | 0 | 0 | 1 | * | * | * |
| 0 | 1 | 0 | 0 | 1 | * | * | * |
| 1 | 1 | 0 | 0 | 1 | * | * | * |
| 0 | 0 | 1 | 0 | 0 | * | * | * |
| 1 | 0 | 1 | 0 | 1 | * | * | * |
| 0 | 1 | 1 | 0 | 1 | * | * | * |
| 1 | 1 | 1 | 0 | 1 | * | * | * |
| 0 | 0 | 0 | 1 | 0 | * | * | * |
| 1 | 0 | 0 | 1 | 1 | * | * | * |
| 0 | 1 | 0 | 1 | 1 | * | * | * |
| 1 | 1 | 0 | 1 | 1 | * | * | * |
| 0 | 0 | 1 | 1 | 1 | * | * | * |
| 1 | 0 | 1 | 1 | 1 | * | * | * |
| 0 | 1 | 1 | 1 | 1 | * | * | * |
| 1 | 1 | 1 | 1 | 1 | * | * | * |
FIG. 12
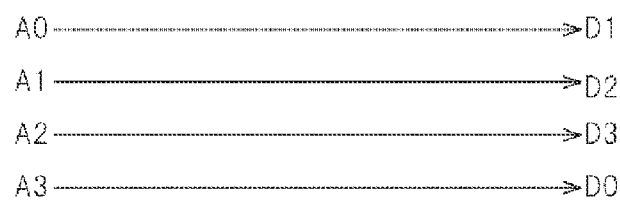

| A0 | A1 | A2 | A3 | D0 | D1 | D2 | D3 |
|----|----|----|----|----|----|----|----|
| 0 | 0 | 0 | 0 | 0 | 0 | 0 | 0 |
| 1 | 0 | 0 | 0 | 0 | 1 | 0 | 0 |
| 0 | 1 | 0 | 0 | 0 | 0 | 1 | 0 |
| 1 | 1 | 0 | 0 | 0 | 1 | 1 | 0 |
| 0 | 0 | 1 | 0 | 0 | 0 | 0 | 1 |
| 1 | 0 | 1 | 0 | 0 | 1 | 0 | 1 |
| 0 | 1 | 1 | 0 | 0 | 0 | 1 | 1 |
| 1 | 1 | 1 | 0 | 0 | 1 | 1 | 1 |
| 0 | 0 | 0 | 1 | 1 | 0 | 0 | 0 |
| 1 | 0 | 0 | 1 | 1 | 1 | 0 | 0 |
| 0 | 1 | 0 | 1 | 1 | 0 | 1 | 0 |
| 1 | 1 | 0 | 1 | 1 | 1 | 1 | 0 |
| 0 | 0 | 1 | 1 | 1 | 0 | 0 | 1 |
| 1 | 0 | 1 | 1 | 1 | 1 | 0 | 1 |
| 0 | 1 | 1 | 1 | 1 | 0 | 1 | 1 |
| 1 | 1 | 1 | 1 | 1 | 1 | 1 | 1 |

| A0 | A1 | A2 | A3 | D0 | D1 | D2 | D3 |
|---|---|---|---|---|---|---|---|
| 0 | 0 | 0 | 0 | 0 | * | 0 | * |
| 1 | 0 | 0 | 0 | 0 | * | 0 | * |
| 0 | 1 | 0 | 0 | 0 | * | 0 | * |
| 1 | 1 | 0 | 0 | 1 | * | 0 | * |
| 0 | 0 | 1 | 0 | 0 | * | 0 | * |
| 1 | 0 | 1 | 0 | 0 | * | 0 | * |
| 0 | 1 | 1 | 0 | 0 | * | 0 | * |
| 1 | 1 | 1 | 0 | 0 | * | 0 | * |
| 0 | 0 | 0 | 1 | 0 | * | 1 | * |
| 1 | 0 | 0 | 1 | 0 | * | 1 | * |
| 0 | 1 | 0 | 1 | 0 | * | 1 | * |
| 1 | 1 | 0 | 1 | 1 | * | 1 | * |
| 0 | 0 | 1 | 1 | 0 | * | 1 | * |
| 1 | 0 | 1 | 1 | 0 | * | 1 | * |
| 0 | 1 | 1 | 1 | 0 | * | 1 | * |
| 1 | 1 | 1 | 1 | 0 | * | 1 | * |

RECONFIGURABLE LOGIC DEVICE CONFIGURED AS A LOGIC ELEMENT OR A CONNECTION ELEMENT

TECHNICAL FIELD

The present invention relates to a reconfigurable logic device.

BACKGROUND ART

Programmable logic devices (PLDs) capable of switching its circuit configuration such as field-programmable gate arrays (FPGAs) are widely used (e.g. Patent Literature 1). The applicant or inventor has developed a "memory-based programmable logic device (MPLD)" (registered trademark) realizing a circuit configuration with a memory cell unit. The MPLD is disclosed, for example, in Patent Literature 1 described below. The MPLD is a device formed by interconnecting memory cell units called multi look-up-tables (MLUTs) in an array, and capable of mounting both functions of a logic circuit and wiring.

The MPLD is a reconfiguration device using as an architecture a six-direction arrangement of a micro memory having a signal line of an address-data pair, and a "memory based reconfigurable logic device (MRLD)" (registered trademark) developed along with the MPLD by the applicant is a reconfiguration device using as an architecture an alternating arrangement of a micro memory having a signal line of an address-data pair and using a synchronous SRAM having one side of an address-data pair.

The MLUT is configured to store truth value data and operate as a wiring element and a logic element. Further, it operates as a reconfiguration device similarly to the FPGA by rewriting the truth value data. The MPLD has a decoder for writing data into all the MLUTs, and specifies an address of the memory cell unit of each MLUT to write the data thereto.

For example, in Patent Literature 1, the memory cell unit selects an address signal input at the time of memory operation and an address signal input at the time of logical operation by an address switching circuit, and any selected address signal is decoded by an address decoder prepared for each memory cell unit to activate a signal line (word line) (Patent Literature 1, FIG. 4, Paragraph [0027]).

In this manner, in the conventional MLUT, the memory cell unit is configured to include a common address decoder for memory operation and logical operation, and select the operation by the selection circuit. Therefore, there has been a problem that each MLUT requires selection by the address switching circuit for selecting a signal of the address decoder, and the address decoder composed of a NOT logic requires a large occupied area compared with the occupied area of the memory cell unit.

CITATION LIST

Patent Literature

Patent Literature 1: JP 2010-239325A

SUMMARY OF INVENTION

Technical Problem

A micro memory referred to as the MLUT is designed as a normal memory, and has an address decoder for decoding an address, and a sense amplifier, in addition to a memory cell array. When a memory is reduced in size, a logic circuit area rate of the address decoder and the sense amplifier is increased to deteriorate area efficiency.

According to an embodiment of the present invention, there is provided a reconfigurable logic device that eliminates the need for a sense amplifier for memory operation from a MLUT body and has a reduced area.

Solution to Problem

Embodiments to solve the problem mentioned above are illustrated by the following item set.

1. A reconfigurable logic device configured as a logic element or a connection element, the reconfigurable logic device including
a plurality of memory cell units, each storing configuration information and configured as the logic element and/or the connection element,
wherein each of the plurality of memory cell units includes
a pair of bit lines for logic arranged corresponding to a column of memory cells,
a word line for logic, and
an inverter unit connected to the pair of bit lines for logic, wherein the inverter unit includes
a first CMOS configured to receive an input signal from one of the pair of bit lines for logic, and including a first MOS transistor and a second MOS transistor, and
a second CMOS configured to receive an input signal from the other of the pair of bit lines for logic, and including a third MOS transistor and a fourth MOS transistor, and
wherein the inverter unit outputs a first differential signal as a set of output signals of the first MOS transistor and the third MOS transistor, and a second differential signal as a set of output signals of the second MOS transistor and the fourth MOS transistor to another memory cell unit as a data signal for logic.

Accordingly, there is provided a reconfigurable logic device that eliminates the need for a sense amplifier for memory operation from a MLUT body and has a reduced area.

2. The reconfigurable logic device according to claim 1, wherein the memory cell unit is a multi look-up-table.

3. The reconfigurable logic device according to claim 1 or 2, further including an address decoder for logic of a differential four-wire logic configured to receive a data signal for logic outputted from another memory cell unit as an address signal for logic.

Since the decoder by wiring configured by a differential four-wire signal is used, the decoder has a simplified configuration excluding a NOT logic to be thereby reduced in size.

4. The reconfigurable logic device according to any one of claims 1 to 3, including an address decoder connected to the plurality of memory cell units, and configured to decode an address signal specifying any memory cell of the plurality of connected memory cell units to output a word line selection signal selecting a word line,
wherein each of the plurality of memory cell units includes
a pair of bit lines for memory arranged corresponding to a column of memory cells, and
a word line for memory connected to the address decoder.

The address decoder of the MLUT can be formed only by wiring to improve memory cell efficiency of the MLUT.

Further, in utilization of a large capacity memory in the MRLD, a memory cell configuration of a short word length can be formed by using a bit line of the MLUT as a local bit line, and supply of data to a global bit line allows the large capacity memory to operate using a conventional sense amplifier. This allows a voltage to be reduced at the time of memory operation to realize a low power consumption memory and a reconfigurable logic device.

5. The reconfigurable logic device according to item 4, further including a sense amplifier connected to the bit line for memory.

When the sense amplifier for a memory is separately prepared, a short distance bit line can reduce variations in bit line to maintain memory operation even at 0.4 V. For example, even when 1.3 V is used at the time of memory writing operation, 0.4 V can be used at the time of logic reading operation to reduce operation power consumption.

6. A operation method for a reconfigurable logic device configured as a logic element or a connection element, and including a plurality of memory cell units, each storing configuration information and configured as the logic element and/or the connection element,
wherein each of the plurality of memory cell units includes
a pair of bit lines for logic arranged corresponding to a column of memory cells,
a word line for logic, and
an inverter unit connected to the pair of bit lines for logic, wherein the inverter unit includes
a first CMOS including a first MOS transistor and a second MOS transistor, and
a second CMOS including a third MOS transistor and a fourth MOS transistor,
the control method including:
receiving, by the inverter unit, an input signal from one of the pair of bit lines for logic;
receiving, by the inverter unit, an input signal from the other of the pair of bit lines for logic; and
outputting, by the inverter unit, a first differential signal as a set of output signals of the first MOS transistor and the third MOS transistor, and a second differential signal as a set of output signals of the second MOS transistor and the fourth MOS transistor to another memory cell unit as a data signal for logic.

7. The control method for a reconfigurable logic device according to item 6, wherein the memory cell unit is a multi look-up-table.

8. The control method for a reconfigurable logic device according to item 6 or 7,
wherein the reconfigurable logic device further includes an address decoder for logic of a differential four-wire logic, and
wherein the address decoder for logic receives a data signal for logic outputted from another memory cell unit as an address signal for logic.

9. The control method for a reconfigurable logic device according to any one of items 6 to 8,
wherein the reconfigurable logic device includes an address decoder connected to the plurality of memory cell units,
wherein each of the plurality of memory cell units includes
a pair of bit lines for memory arranged corresponding to a column of memory cells, and
a word line for memory connected to the address decoder, and
wherein the address decoder receives an address signal specifying any memory cell of the plurality of connected memory cell units, and decodes the address signal to output a word line selection signal selecting a word line.

10. The control method for a reconfigurable logic device according to item 9,
wherein the reconfigurable logic device further includes a sense amplifier connected to the bit line for memory, and
wherein the sense amplifier reads data from the bit line for memory.

11. A program for controlling a reconfigurable logic device,
wherein the reconfigurable logic device includes a plurality of memory cell units, each storing a program composed of truth table data and configured as a logic element and/or a connection element,
wherein each of the plurality of memory cell units includes
a pair of bit lines for logic arranged corresponding to a column of memory cells,
a word line for logic, and
an inverter unit connected to the pair of bit lines for logic, wherein the inverter unit includes
a first CMOS including a first MOS transistor and a second MOS transistor, and
a second CMOS including a third MOS transistor and a fourth MOS transistor,
wherein the inverter unit receives an input signal from one of the pair of bit lines for logic,
wherein the inverter unit receives an input signal from the other of the pair of bit lines for logic, and
wherein the inverter unit outputs a first differential signal as a set of output signals of the first MOS transistor and the third MOS transistor, and a second differential signal as a set of output signals of the second MOS transistor and the fourth MOS transistor to another memory cell unit as a data signal for logic,
the program causing the memory cell unit to execute:
processing of outputting a logical operation of a value stored in a memory cell specified by the certain address line to a data line to operate as a logic circuit; and
processing of outputting the value stored in the memory cell specified by the certain address line to a data line connected to an address line of another storage unit to operate as a connection circuit.

12. The program according to item 11, wherein the memory cell unit is a multi look-up-table.

13. The program according to item 11 or 12,
wherein the reconfigurable logic device further includes an address decoder for logic of a differential four-wire logic, and
wherein the address decoder for logic receives a data signal for logic outputted from another memory cell unit as an address signal for logic.

14. The program according to any one of items 11 to 13,
wherein the reconfigurable logic device includes an address decoder connected to the plurality of memory cell units,
wherein each of the plurality of memory cell units includes
a pair of bit lines for memory arranged corresponding to a column of memory cells, and
a word line for memory connected to the address decoder, and
wherein the address decoder receives an address signal specifying any memory cell of the plurality of connected memory cell units, and decodes the address signal to output a word line selection signal selecting a word line.

15. The program according to item 14, wherein the reconfigurable logic device further includes a sense amplifier connected to the bit line for memory, and wherein the sense amplifier reads data from the bit line for memory.

16. A storage medium configured to store the program according to any one of items 11 to 15.

Advantageous Effects of Invention

There is provided a reconfigurable logic device that eliminates the need for a sense amplifier for memory operation from a MLUT body and has a reduced area.

BRIEF DESCRIPTION OF DRAWINGS

FIG. 7A is a diagram for describing an example of a logical address decoder in a differential four-wire logic.

FIG. 10 is a diagram illustrating an example of the MLUT operating as a logic circuit.

FIG. 11 is a diagram illustrating a truth table of the logic circuit of FIG. 10.

FIG. 12 is a diagram illustrating an example of the MLUT operating as a connection element.

MODE(S) FOR CARRYING OUT THE INVENTION

With reference to the drawings, 1. Reconfigurable Logic Device, 2. MLUT Array of MPLD, 3. MLUT of MRLD, 4. Configuration of MLUT, 5. Connection and Logical Operation of MLUT, and 6. Method for Generating Truth Table Data, will be discussed below in this order.

1. Reconfigurable Logic Device

Figure 1:
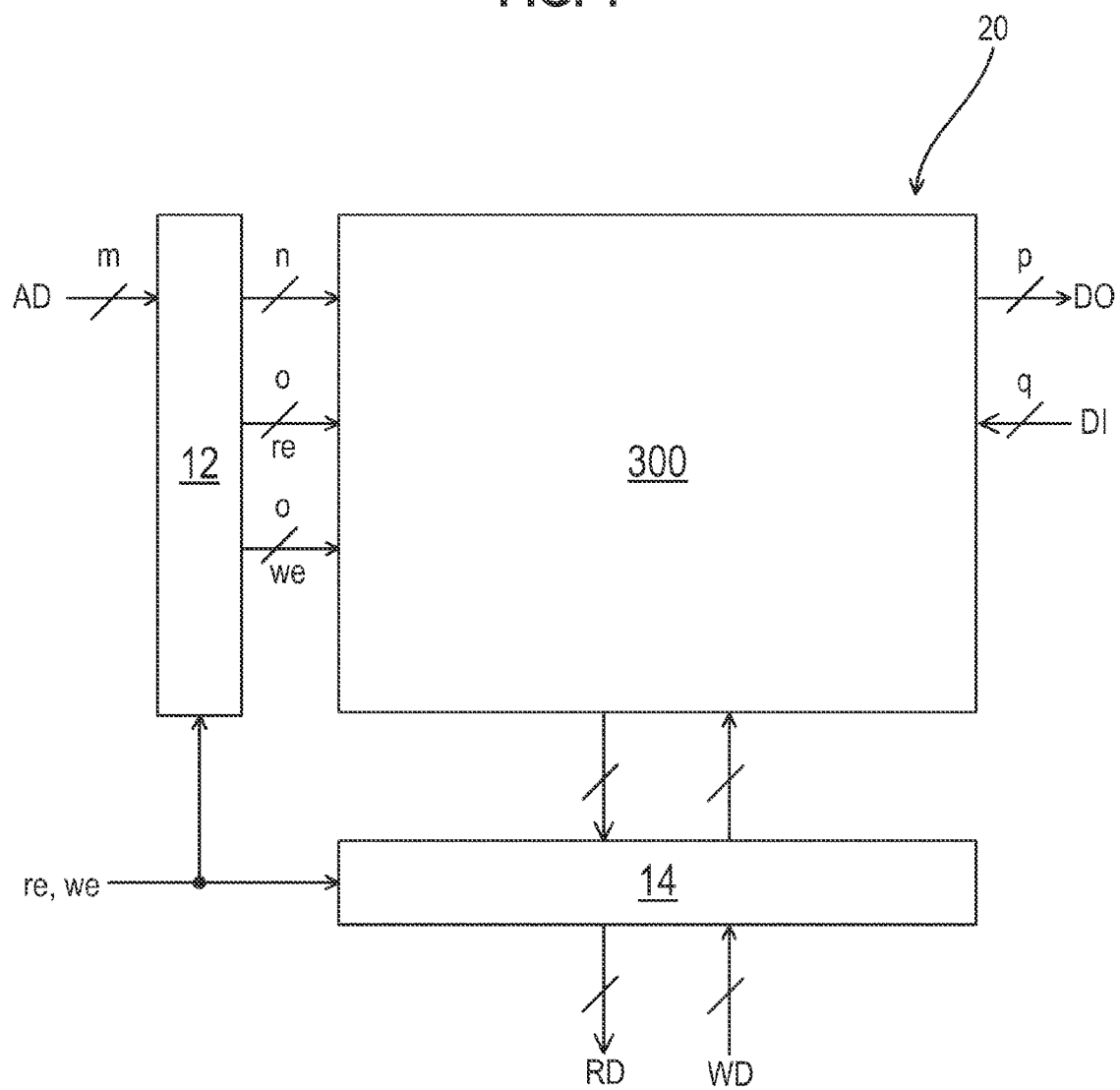
FIG. 1 is a diagram illustrating an example of a reconfigurable logic device according to an embodiment.

FIG. 1 is a diagram illustrating an example of a reconfigurable logic device according to the embodiment. Hereinafter, the reconfigurable logic device (referred to also as a "programmable logic device") is referred to also as a MRLD or MPLD. Note that the MRLD or MPLD is also described in Background Art, but the MRLD or MPLD according to the present invention, which is called the same trademark, has a technical feature different from that of a conventional one.

A reconfigurable logic device 20 shown in FIG. 1 has an MLUT array 300 formed by arranging in an array a plurality of MLUTs to be described later, a decoder 12 specifying a memory reading operation and writing operation of the MLUT, and an input/output unit 14.

In a logical operation of the reconfigurable logic device 20, signals of a data input DI and a data output DO indicated by the solid line are used. The data input DI is used as an input signal of a logic circuit. Further, the data output DO is used as an output signal of the logic circuit.

The logic realized by the logical operation of the reconfigurable logic device 20 is realized by truth table data stored in the MLUT 30. Some MLUTs 30 operate as a logic element serving as a combinational circuit of an AND circuit, an adder, and the like. The other MLUTs operate as a connection element that makes a connection between the MLUTs 30 that create the combinational circuit. The rewriting of the truth table data for the reconfigurable logic device 20 to realize the logic element and the connection element is performed by the writing operation to the configuration memory of the MLUT 30.

The writing operation of the reconfigurable logic device 20 is performed by an address for writing AD and data for writing WD, and the reading operation is performed by the address for writing AD and data for reading RD.

The address for writing AD is an address that specifies the memory cell in the MLUT 30. The address for writing AD specifies 2 raised to the m-th power n memory cells by means of m signal lines. The address for writing AD is used in both cases of the reading operation and the writing operation of the memory, is decoded by the decoder 12 via the m signal lines, and selects the memory cell as an object. In the embodiment, as described later, the decoding of an operation address for logic DI is performed by a decoder in the MLUT 30.

The decoder 12 decodes the address for writing AD in accordance with control signals such as a read enable signal re and a write enable signal we, and outputs a decoded address n to the MLUT 30. The decoded address n is used as an address that specifies the memory cell in the configuration memory of the MLUT 30.

The sense amplifier 14 outputs the data for reading RD in accordance with a read enable signal re.

2. MLUT Array of MPLD

Figure 2:
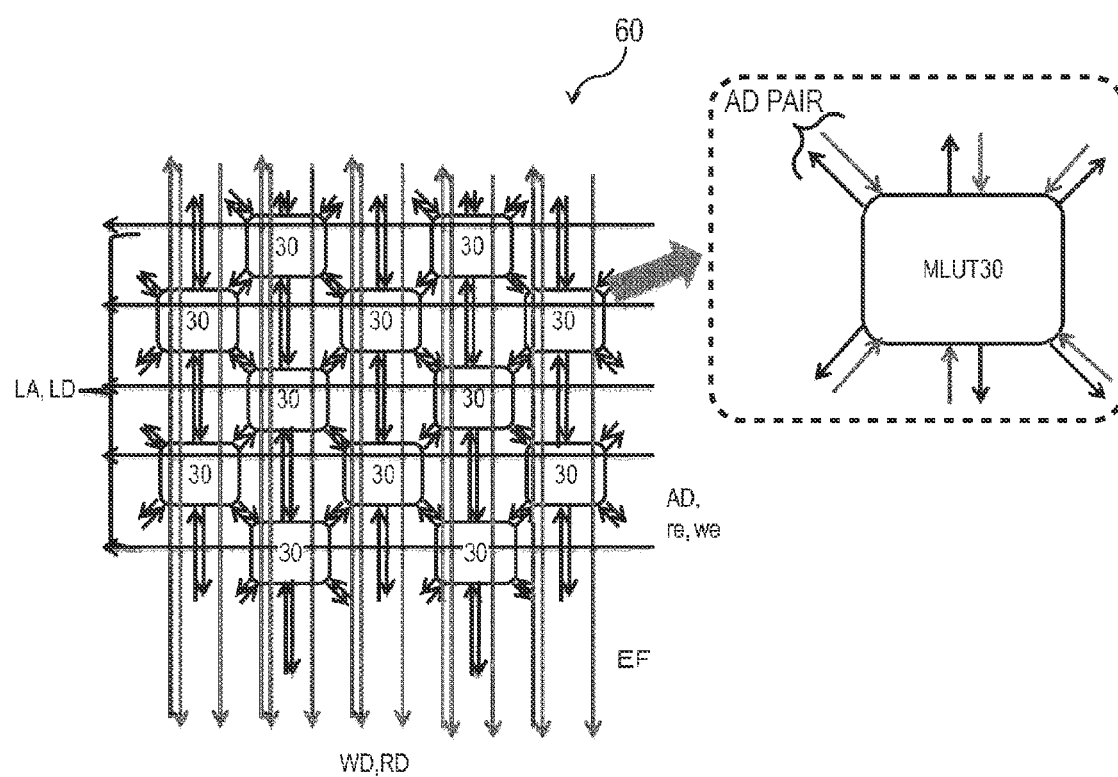
FIG. 2 is a diagram illustrating an example of an MLUT array of an MPLD.

FIG. 2 is a diagram illustrating an example of the MLUT array of the MPLD 60. The MPLD 60 defines a pseudo bidirectional line by forming one bit of an address line and one bit of a data line into a pair as shown in an upper-right portion of FIG. 2. This pseudo bidirectional line is called an "AD pair" in the MPLD 60. The MLUT having N AD pairs is realized by using a memory having N bits in width of the address line and N bits in width of the data line. In the MLUT array 300 of the MPLD 60, the adjacent MLUTs 30 are connected with each other by a pair of AD pairs.

3. MLUT Array of MRLD

The MLUT array shown in FIG. 3 and FIG. 4 to be hereinafter described uses an alternating arrangement as its architecture, and therefore it is the MLUT array of the MRLD.

Figure 3:
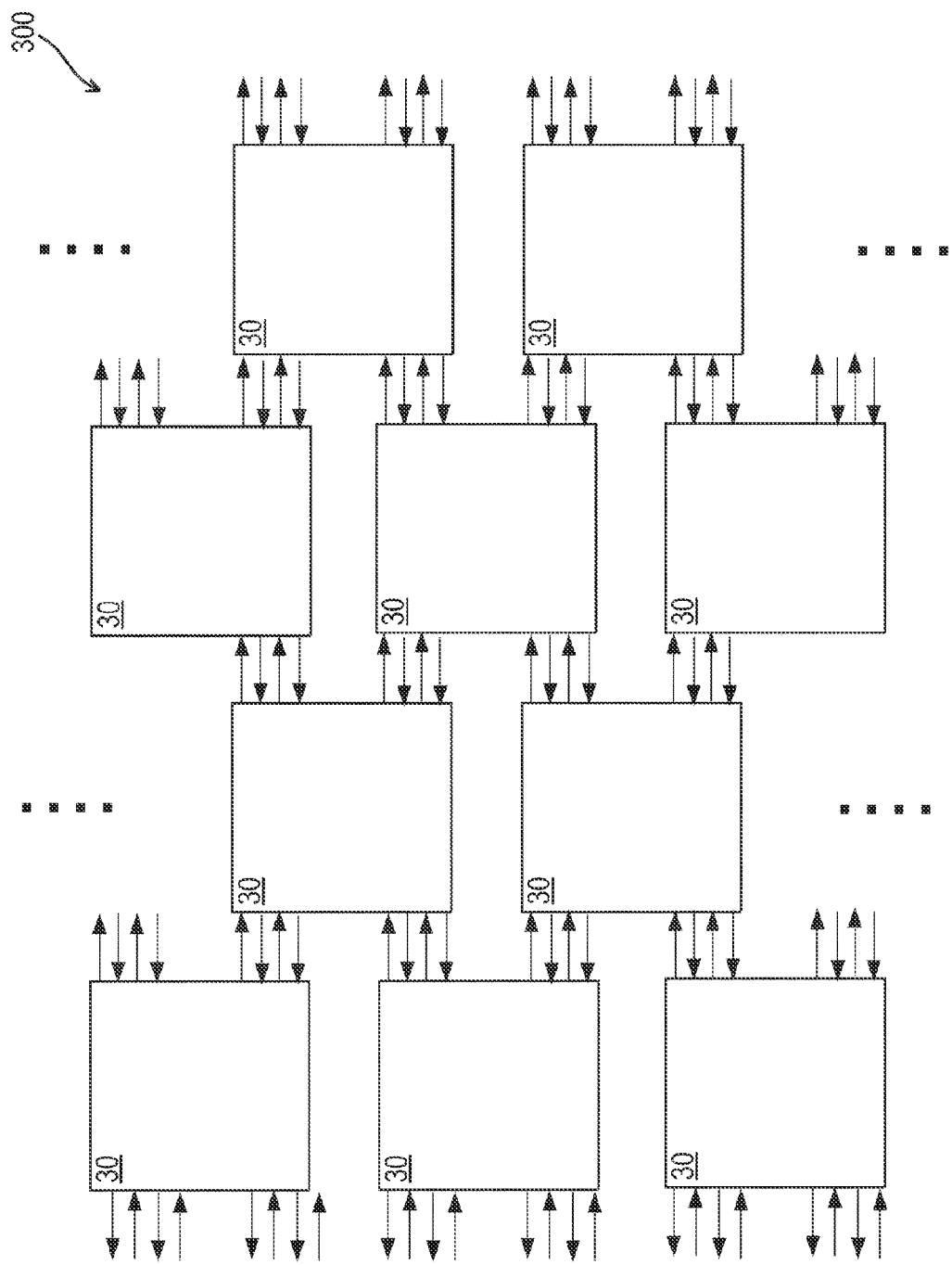
FIG. 3 is a diagram for describing an example of an MLUT array of a two-direction arrangement.

FIG. 3 is a diagram for describing an example of the MLUT array of a two-direction arrangement. Each arrow shown in FIG. 3 is a data input line or a data output line connected to another adjacent MLUT. In the MLUT array 300 shown in FIG. 3, the MLUT 30 is connected to another adjacent MLUT 30 by two data input lines or data output lines. In other words, the MLUTs are connected to each other by a plurality of data input lines or data output lines. Each of the adjacent MLUTs is connected to two MLUTs in each of the input direction and the output direction in order to enhance configurability. This arrangement will be hereinafter referred to as the "alternating arrangement".

The alternating arrangement-type MLUT makes multi-bit data processing possible by using a plurality of data lines and bit lines, and facilitates the creation of a logic library because the direction of the flow of data in the input and output directions can be limited.

Figure 4:
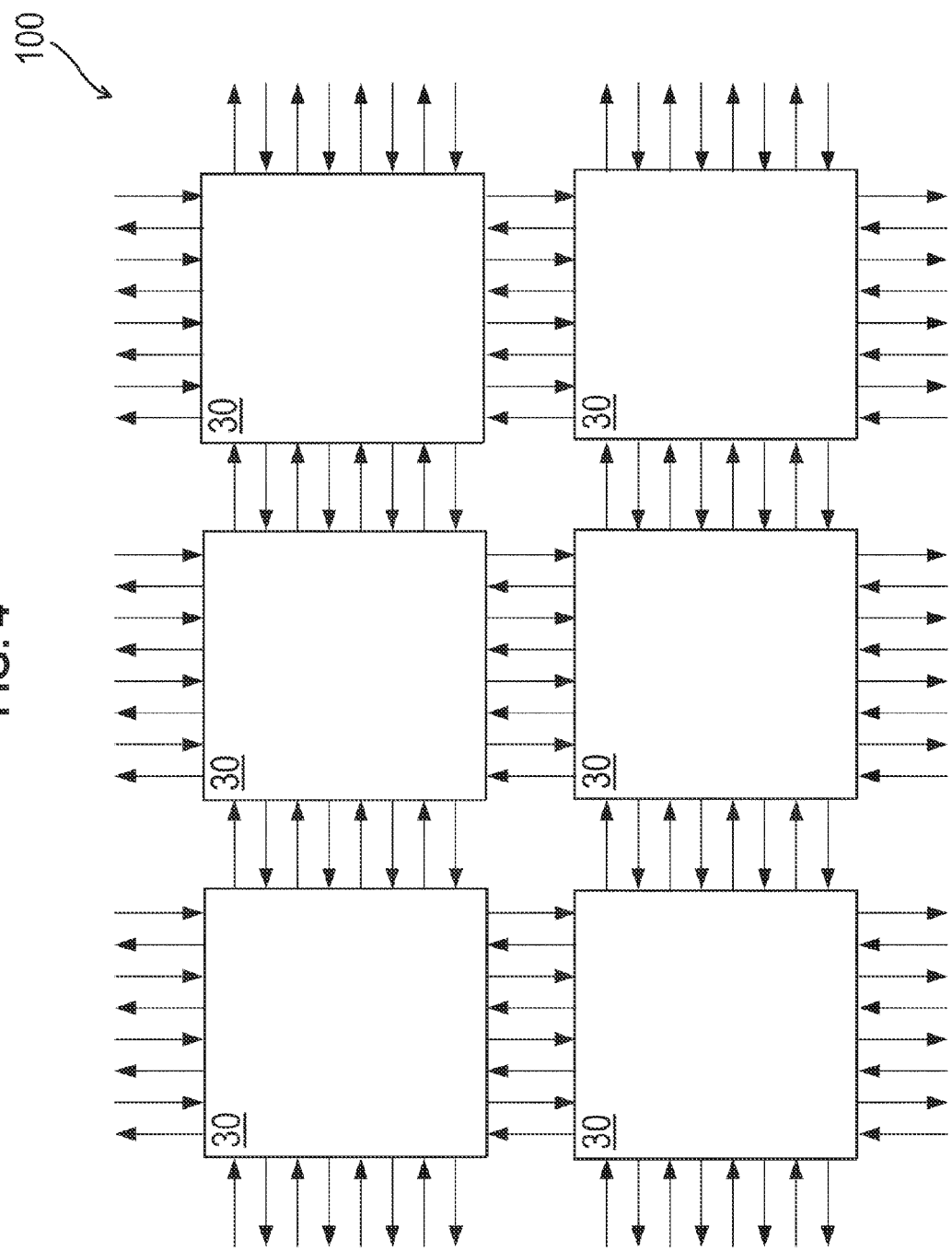
FIG. 4 is a diagram for describing an example of an MLUT array of a four-direction arrangement.

FIG. 4 is a diagram for describing an example of the MLUT array of a four-direction arrangement. The MLUT array 100 shown in FIG. 4 is an arrangement similar to that of the FPGA. This configuration makes it possible to employ a configuration similar to that of the FPGA, and facilitates the creation of the configuration data of the MRLD by using a logically configured state created with an FPGA tool. For example, configuring the upper left, the upper middle, and the lower left of the drawing as switch blocks and the lower middle as an LUT block can express an equivalent to the CLB of the FPGA, and create truth value data from the configured state of the FPGA.

Figure 5:
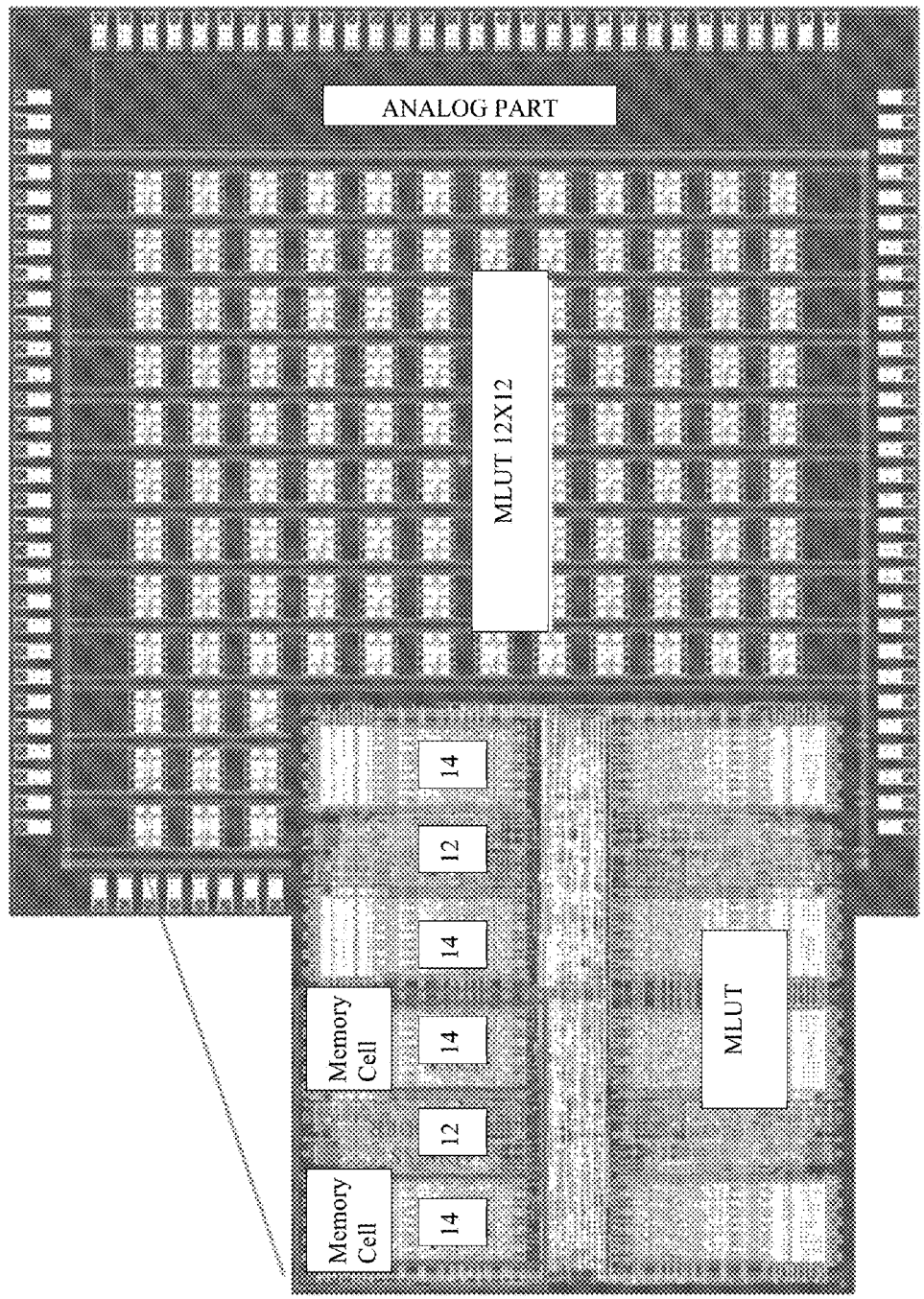
FIG. 5 is a diagram illustrating an example of an area of a sense amplifier and an address decoder in a conventional MLUT.

FIG. 5 is a diagram illustrating an example of an area of a sense amplifier and an address decoder of a conventional MLUT. The conventional MLUT 30 is designed as a normal memory, and has not only the memory cell array, but also the address decoder 12 decoding an address, and the sense amplifier 14. As shown in FIG. 5, when the memory is reduced in size, a logic circuit area rate of the address decoder 12 and the sense amplifier 14 is increased to deteriorate area efficiency.

4. Configuration of MLUT

The micro memory referred to as the MLUT is designed as a normal memory, and has not only the memory cell unit, but also the address decoder decoding an address, and the sense amplifier. When the memory is reduced in size, a logic circuit area rate of the address decoder and the sense amplifier is increased to deteriorate area efficiency.

The whole content of the reconfigurable logic device, the logical address decoder, and the memory cell will be described below in FIG. 6, FIGS. 7A to 7C, and FIG. 8, respectively.

4.1 Inverter Unit

Figure 6:
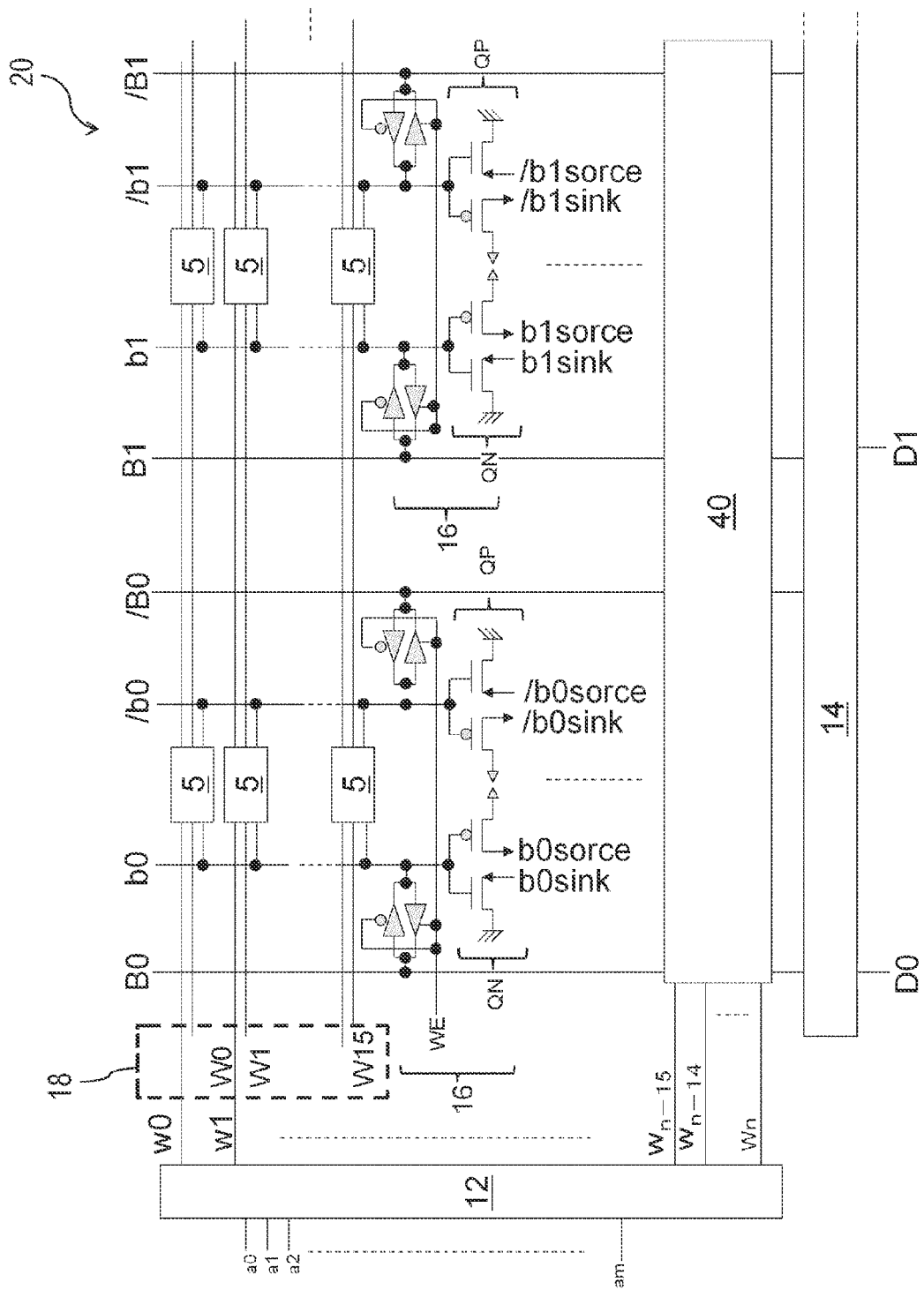
FIG. 6 is a diagram illustrating an example of a reconfigurable logic device according to an embodiment.

FIG. 6 is a diagram illustrating an example of the reconfigurable logic device according to the embodiment. The reconfigurable logic device shown in FIG. 6 includes an inverter unit 16 and a logical address decoder 18, in a data output of a memory cell array. The inverter unit 16 has two complementary metal oxide semiconductors (CMOSs) that receive an input signal from one of a pair of bit lines for logic (b0, /b0). In the CMOS, a P-channel MOS field effect transistor (MOSFET) QP and a drain terminal of an N-channel MOSFET QN are separated and each is defined as a transmission terminal. The drain terminal of the P-channel MOSFET QP is defined as a "source" side transmission terminal and the drain terminal of the N-channel MOSFET QN is defined as a "sink" side transmission terminal.

In the MOSFET, the drain and the source terminals are separated, and both can be defined as a source (sorce) and a sink source of data, which are defined as a source signal and a sink source of addresses An, /An in the next stage. That is, b0sink and b0sorce are inputted to the drain terminal of the N-channel MOSFET QN as an output signal of a data line outputted to the logical address decoder 18 of the MLUT 30 in the subsequent stage. Similarly, /b0sink and /b0sorce are inputted to the drain terminal of the P-channel MOSFET QP as an output signal of a data line outputted to the logical address decoder 18 of the MLUT 30 in the subsequent stage. In this manner, the inverter unit 16 outputs data invoked from the memory cell array as the differential signals (b0sink, /b0sink) and the differential signals (b0sorce, /b0sorce) to the MLUT in the subsequent stage. The connection between the data and the address can be realized by bringing the MPLD and MRLD into a predetermined arrangement (six-direction arrangement or alternating arrangement).

The address decoder 12 is an address decoder for memory operation. The addresses of the memory cell array of all the MLUTs 30 included in the reconfigurable logic device 20 fall within range. Word lines (w0, . . . , wn) activated by addresses (a0, . . . , am) for logical operation inputted to this address decoder 12 are read as a data signal (D0) from the sense amplifier 14. At this time, since data lines (B0, /B0) of the MLUT are much longer than bit lines for logic (b0, /b0), a high voltage is required for securing a margin, thus requiring the sense amplifier 14. For example, since the MLUT uses a memory cell array reduced in size more than a normal SRAM, which has word lines of not more than 256, the length of the bit lines is reduced.

On the other hand, since a bias voltage for logical operation can be reduced more than a bias voltage for memory operation, it becomes possible to save power for logical operation or connection operation of the MLUT. That is, when the sense amplifier 14 for memory is separately prepared, the bit line for memory as a long distance bit line and the bit line for logic as a short distance bit line are formed in two series, allowing an operation voltage to be changed. For example, the bit line for memory can be set to 1.3 V and the bit line for logic can be set to 0.4V.

Furthermore, a conventional selection circuit can be eliminated and the address decoder for logic can perform the memory operation and the logical operation separately.

4.2 Logical Address Decoder

Figure 7B:
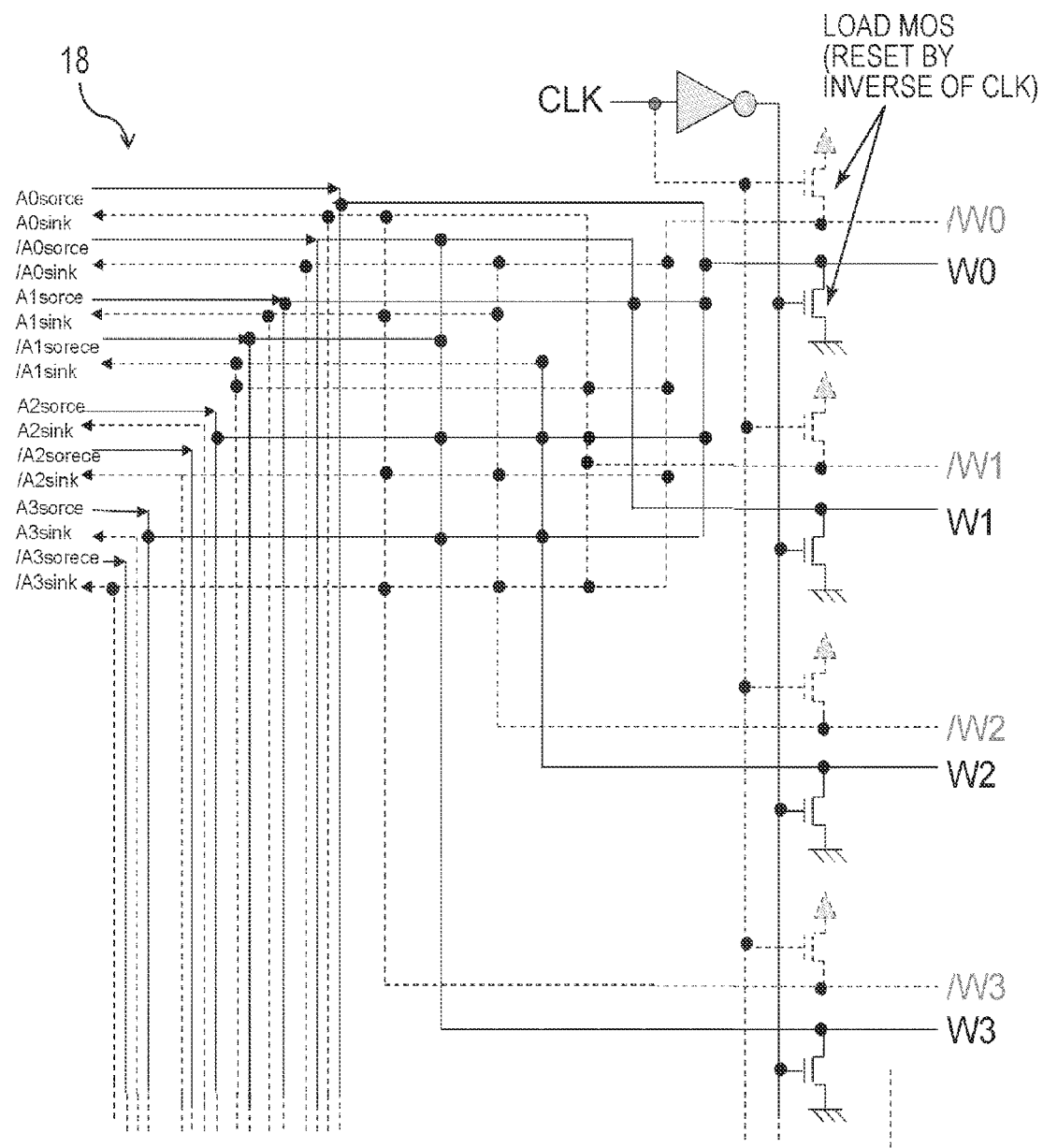
FIG. 7B is a diagram for describing an example of a logical address decoder in a differential four-wire logic.
Figure 7C:
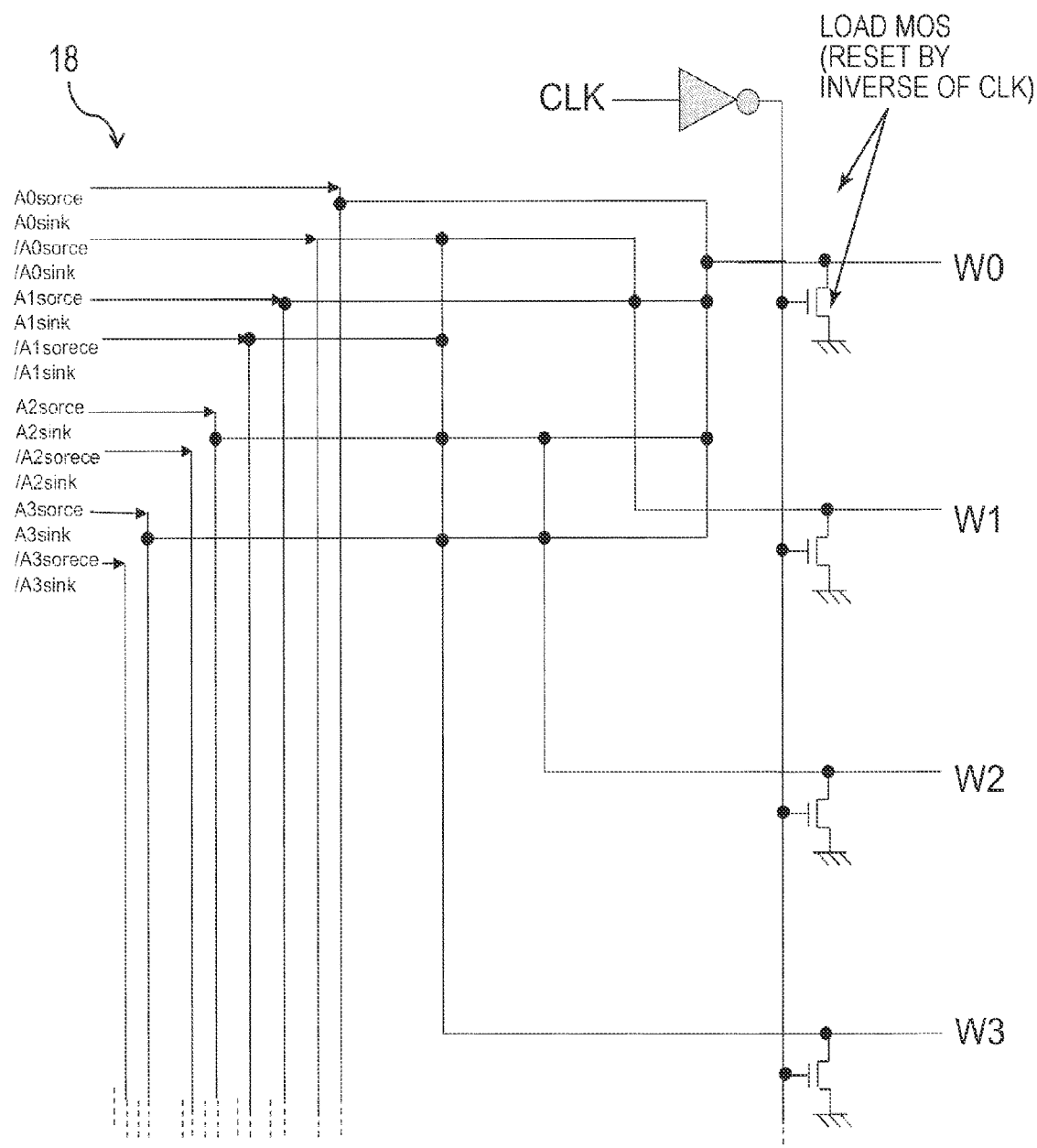
FIG. 7C is a diagram for describing an example of a logical address decoder in a differential four-wire logic.

FIGS. 7A to 7C are a diagram for describing an example of the logical address decoder in a differential four-wire logic. FIG. 7B is a diagram in which /Wx is deleted, and FIG. 7C is a diagram in which the circuit is simplified. The logical address decoder 18 receives differential four-wire signals of A0 sorce and A0 sink, and /A0 sorce and /A0 sink by using a data signal for logic outputted from the MLUT in the previous stage as a predetermined address signal. The wiring is made for them in accordance with a word line selection operation. For example, when all the address are "0", an operation is required in which the word line W0 is set to "1" and the others are set to "0". However, if the differential signal /An is available, such an operation can be realized by setting the word line W0 to "1" when even one of the /An is set to "1", and by setting the word line W0 to "1" when all of the /An is set to "0". For this end, when the source (sorce) signal of the /An is subjected to an wired OR and connected to the load N-MOS to be defined as the W0, only the wiring can produce the address decoder for the W0. Conversely, when the sink (sink) of the An is subjected to a wired OR and connected to the load P-channel MOSFET QP, /W0 can be realized. In this manner, each word line is made to have a necessary connection to configure the Wn, /Wn. The load MOS is charged to hold the voltage and retains its voltage value. When the address is changed, reset is once required. However, when the circuit form applying /CLK to the gate is used, the word line is selected by a clock and data is outputted from the bit line and this state is retained by the F/F of the sense amplifier, so that memory operation is performed even after the reset after the clock. For the logical operation, since the output in the previous stage is received by the address and this state is retained by the load MOS of the address decoder in the next stage, the bit line data is retained even after the non-selection of the word line after the clock, so that predetermined logical operation is performed. In FIG. 7B, Q and /Q are created in the differential logic. In this case, since only the Q is necessary and the /Wn is not necessary, a situation excluding the /Wn is illustrated. In FIG. 7C, there is only the wiring and there is only the wiring other than the load MOSs, allowing the area to be reduced.

4.3. Memory Cell

Figure 8:
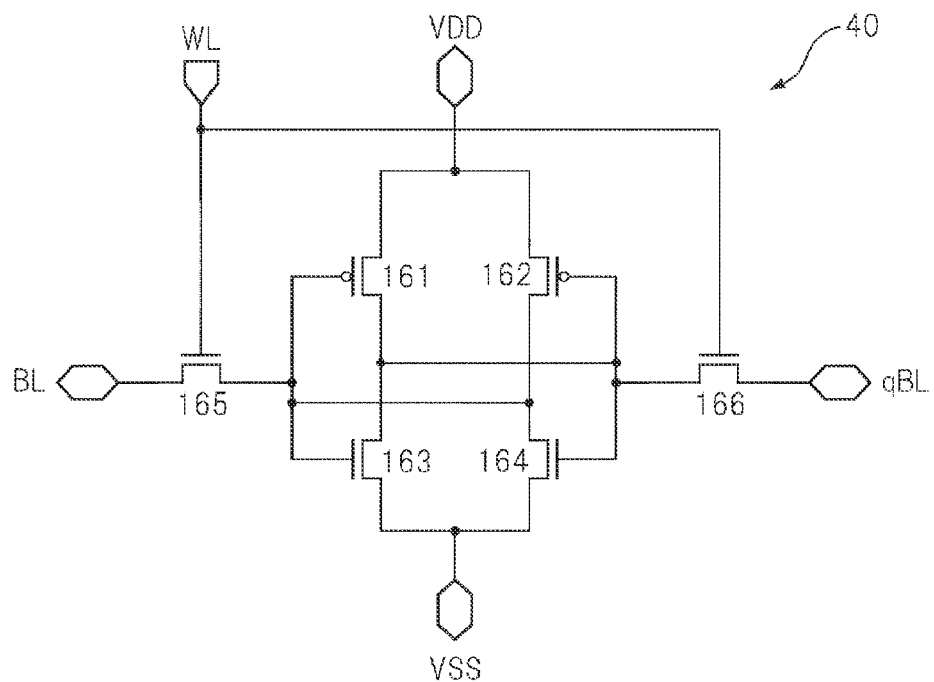
FIG. 8 is a diagram illustrating an example of a memory cell.

FIG. 8 is a diagram illustrating an example of the memory cell of a single port. A memory cell 5 is disposed at an intersection between a word line as a signal line of a decode signal and a bit line. The memory cell 5 includes pMOS transistors 161 and 162, and nMOS transistors 163, 164, 165 and 166. The source of the pMOS transistor 161 and the source of the pMOS transistor 162 are connected to a VDD (power supply voltage end). The drain of the nMOS transistor 163 and the drain of the nMOS transistor 164 are connected to a VSS (ground voltage end).

The drain of the nMOS transistor 165 is connected to a bit line b. The gate of the nMOS transistor 165 is connected to a word line WL. The drain of the nMOS transistor 166 is connected to a bit line /b. The gate of the nMOS transistor 166 is connected to the word line WL.

The above-described configuration allows a storage element 40 in writing operation to hold a signal level transmitted from the bit line b and the bit line /b in the pMOS transistors 161 and 162 and the nMOS transistors 163 and 164 by a signal level "H (High)" of the word line WL, and allows the storage element 40 in reading operation to transmit the signal level held in the pMOS transistors 161 and 162 and the nMOS transistors 163 and 164 to the bit line b and the bit line /b by the signal level "H" of the word line WL.

5. Logical or Connection Operation of MLUT

There will be described below the truth table data causing the MLUT to execute processing of outputting a logical operation of a value stored in a memory cell specified by a certain address line to a data line to operate as a logic circuit (logic element), and/or processing of outputting a value stored in a memory cell specified by a certain address line to a data line connected to an address line of another storage unit to operate as a connection circuit (connection element).

5.1 Logic Element

Figure 9:
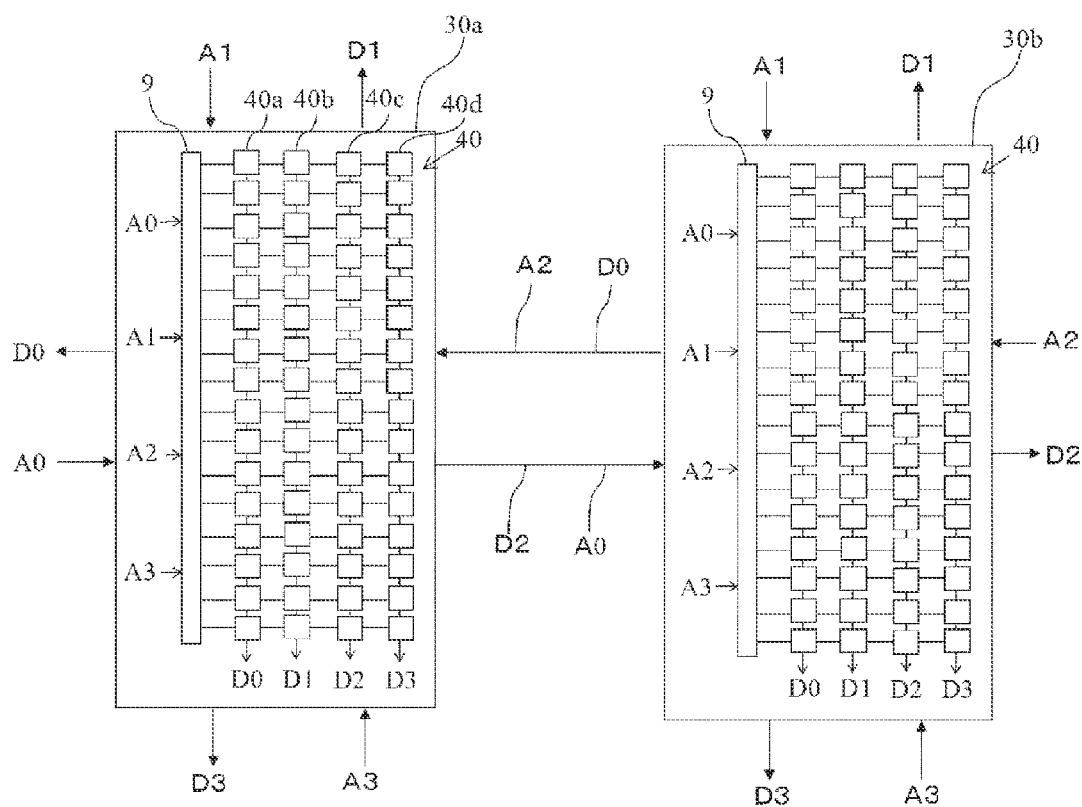
FIG. 9 is a diagram illustrating an example of an MLUT operating as a logic element.

FIG. 9 is a diagram illustrating an example of the MLUT operating as the logic element. The MLUT shown in FIG. 9 is a circuit similar to the MLUT shown in FIG. 10 or the semiconductor memory device shown in FIG. 12 or FIG. 7. In FIG. 9, for convenience of description, the description of an address switching circuit 10A and an output data switching circuit 10B is omitted. The MLUTs 30A and 30B shown in FIG. 9 each have four address input LA lines for logic A0 to A3, four data lines for logical operation D0 to D3, storage elements 40 of 4×16=64, and an address decoder 9. The data lines for logical operation D0 to D3 connect the 24 storage elements 40 in series. The address decoder 9 is configured to select the four storage elements connected to any of the 16 word lines on the basis of signals inputted to the address input LA lines for logic A0 to A3. The four storage elements are connected to the data lines for logical operation D0 to D3 to output data stored in the storage elements to the data lines for logical operation D0 to D3, respectively. For example, when an appropriate signal is inputted to the address input LA lines for logic A0 to A3, it can be configured to select four storage elements 40A, 40B, 40C and 40D. Here, the storage element 40A is connected to the data line for logical operation D0, the storage element 40B is connected to the data line for logical operation D1, the storage element 40D is connected to the data line for logical operation D2, and the storage element 40D is connected to the data line for logical operation D3. Signals stored in the storage elements 40A to 40D are then outputted to the data lines for logical operation D0 to D3. In this manner, the MLUTs 30A and 30B receive address inputs for logic LA from the address input LA lines for logic A0 to A3, and values stored in the four storage elements 40 selected by the address decoder 9 using the address inputs for logic LA are outputted to the data lines for logical operation D0 to D3 as data for logical operation, respectively. Note that the address input LA line for logic A2 of the MLUT 30A is connected to the data line for logical operation D0 of the adjacent MLUT 30B, the MLUT 30A receives the data for logical operation outputted from the MLUT 30B as the address input for logic LA, and the data line for logical operation D2 of the MLUT 30A is connected to the address input LA line for logic A0 of the MLUT 30B and the data for logical operation outputted by the MLUT 30A is received by the MLUT 30B as the address input for logic LA. For example, the data line for logical operation D2 of the MLUT 30A outputs a signal stored in any one of the 16 storage elements connected to the data line for logical operation D2 to the address input LA for logic A0 of the MLUT 30B on the basis of the signals inputted to the address input LA lines for logic A0 to A3 of the MLUT 30A. Similarly, the data line for logical operation D0 of the MLUT 30B outputs a signal stored in any one of the 16 storage elements connected to the data line for logical operation D0 to the address input LA for logic A2 of the MLUT 30A on the basis of the signals inputted to the address input LA lines for logic A0 to A3 of the MLUT 30B. In this manner, the coupling between the MPLDs uses a pair of the address line and the data line. The pair of the address line and the data line used for coupling the MLUTs, such as the address input LA line for logic A2 and the data line for logical operation D2 of the MLUT 30A, is hereinafter referred to as the "AD pair".

Note that the MLUTs 30A and 30B have four AD pairs in FIG. 9, but the number of the AD pairs is not limited to four as described later.

FIG. 10 is a diagram illustrating an example of the MLUT operating as a logic circuit. In this example, the address input LA lines for logic A0 and A1 are taken as an input of a two-input NOR circuit 701, and the address input LA lines for logic A2 and A3 are taken as an input of a two-input NAND circuit 702. Then a logic circuit is configured in which the output of the two-input NOR circuit and the output of the two-input NAND circuit 702 are inputted to a two-input NAND circuit 703, and the output of the two-input NAND circuit 703 is outputted to the data line for logical operation D0.

FIG. 11 is a diagram illustrating a truth table of the logic circuit shown in FIG. 10. Since the logic circuit of FIG. 10 has four inputs, all the inputs of the inputs A0 to A3 are used as an input. On the other hand, since it has only one output, only the output D0 is used as an output. "*" is described in the columns of the outputs D1 to D3 of the truth table. This indicates that the column may be either "0" or "1". However, when truth table data is actually written to the MLUT for reconfiguration, it is necessary to write any value of "0" or "1" to these columns.

5.2 Connection Element

FIG. 12 is a diagram illustrating an example of the MLUT operating as a connection element. In FIG. 12, the MLUT as a connection element operates to output a signal of the address input LA line for logic A0 to the data line for logical operation D1, output a signal of the address input LA line for logic A1 to the data line for logical operation D2, and output a signal of the address input LA line for logic A2 to the data line for logical operation D3. The MLUT as a connection element further operates to output a signal of the address input LA line for logic A3 to the data line for logical operation D1.

Figures 13, 14:
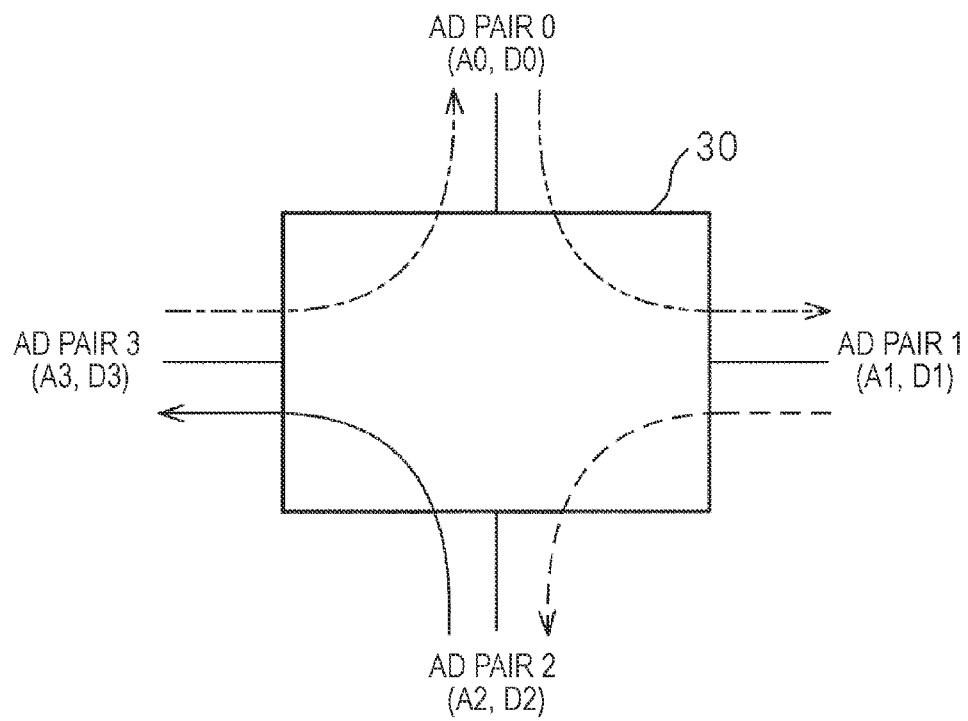
FIG. 13 is a diagram illustrating a truth table of the connection element of FIG. 12.
FIG. 14 is a diagram illustrating an example of the connection element realized by the MLUT having four AD pairs.

FIG. 13 is a diagram illustrating a truth table of the connection element shown in FIG. 12. The connection element shown in FIG. 12 has four inputs and four outputs. Therefore, all the inputs of the inputs A0 to A3 and all the outputs of the outputs D0 to D3 are used. According to the truth table shown in FIG. 13, the MLUT operates as a connection element that outputs a signal of the input A0 to the output D1, outputs a signal of the input A1 to the output D2, outputs a signal of the input A2 to the output D3, and outputs a signal of the input A3 to the output D0.

FIG. 14 is a diagram illustrating an example of the connection element realized by the MLUT having four AD pairs AD0, AD1, AD2 and AD3. The AD0 has the address input LA line for logic A0 and the data line for logical operation D0. The AD1 has the address input LA line for logic A1 and the data line for logical operation D1. The AD2 has the address input LA line for logic A2 and the data line for logical operation D2. The AD3 has the address input LA line for logic A3 and the data line for logical operation D3. In FIG. 14, the one-dot chain line indicates a signal flow where a signal inputted to the address input LA line for logic A0 of the AD pair 0 is outputted to the data line for logical operation D1 of the AD pair 1. The two-dot chain line indicates a signal flow where a signal inputted to the address input LA line for logic A1 of the second AD pair 1 is outputted to the data line for logical operation D2 of the AD pair 2. The broken line indicates a signal flow where a signal inputted to the address input LA line for logic A2 of the AD pair 2 is outputted to the data line for logical operation D3 of the AD pair 3. The solid line indicates a signal flow where a signal inputted to the address input LA line for logic A3 of the AD pair 3 is outputted to the data line for logical operation D0 of the AD pair 0.

Note that the MLUT 30 has four AD pairs in FIG. 14, but the number of the AD pairs is not limited to four.

5.3 Combination Function of Logic Element and Connection Element

Figures 15, 16:
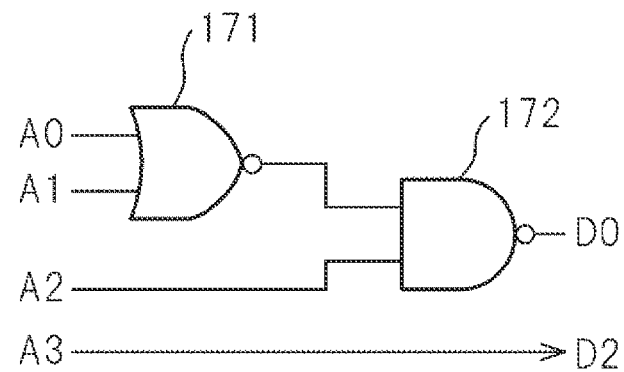
FIG. 15 is a diagram illustrating an example where one MLUT operates as the logic element and the connection element.
FIG. 16 illustrates a truth table of the logic element and the connection element of FIG. 15.

FIG. 15 is a diagram illustrating an example where one MLUT operates as the logic element and the connection element. In the example shown in FIG. 15, the address input LA lines for logic A0 and A1 are taken as an input of a two-input NOR circuit 121, and the output of the two-input NOR circuit 121 and the address input LA line for logic A2 are taken as an input of a two-input NAND circuit 122. Then a logic circuit is configured in which the output of the two-input NAND circuit 122 is outputted to the data line for logical operation D0. At the same time, a connection element is configured in which a signal of the address input LA line for logic A3 is outputted to the data line for logical operation D2.

FIG. 16 illustrates a truth table of the logic element and the connection element of FIG. 15. The logical operation of FIG. 15 uses three inputs of the inputs D0 to D3 and uses one output D0 as an output. On the other hand, the connection element of FIG. 16 is configured to output a signal of the input A3 to the output D2.

Figure 17:
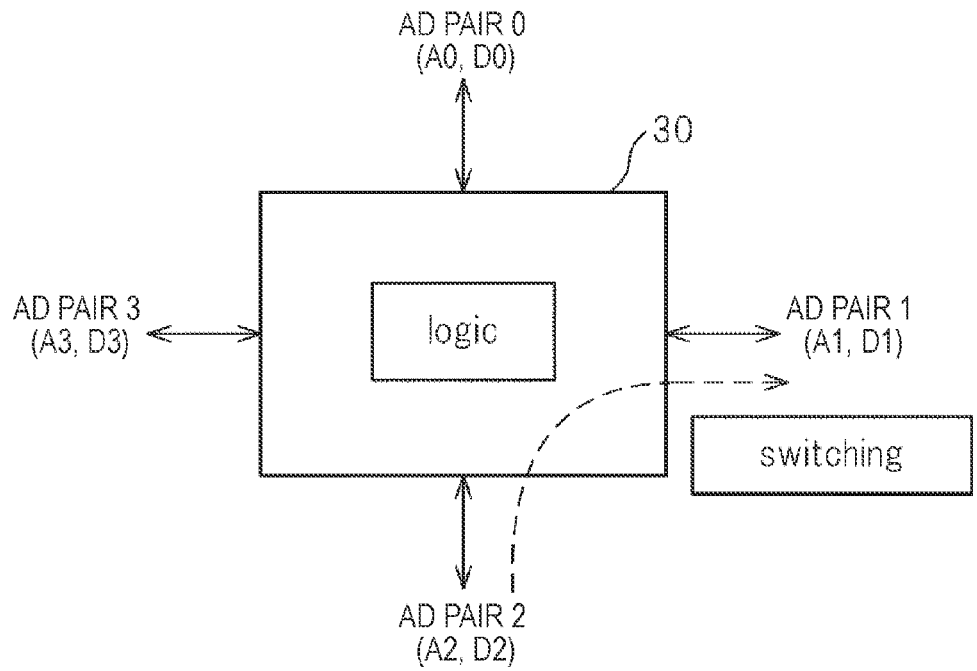
FIG. 17 is a diagram illustrating an example of a logical operation and the connection element realized by the MLUT having the AD pairs.

FIG. 17 is a diagram illustrating an example of the logical operation and the connection element realized by the MLUT having four AD pairs AD0, AD1, AD2 and AD3. Similarly to the MLUT shown in FIG. 14, the AD0 has the address input LA line for logic A0 and the data line for logical operation D0. The AD1 has the address input LA line for logic A1 and the data line for logical operation D1. The AD2 has the address input LA line for logic A2 and the data line for logical operation D2. The AD3 has the address input LA line for logic A3 and the data line for logical operation D3. As described above, the MLUT 30 realizes two operations of the three-input one-output logical operation and the one-input one-output connection element with one MLUT 30. Specifically, the logical operation uses the address input LA line for logic A0 of the AD pair 0, the address input LA line for logic A1 of the AD pair 1, and the address input LA line for logic A2 of the AD pair 2 as an input, and uses the address line of the data line for logical operation D0 of the AD pair 0 as an output. Further, as indicated by the broken line, the connection element outputs a signal inputted to the address input LA line for logic A3 of the AD pair 3 to the data line for logical operation D2 of the AD pair 2.

As described above, since the MLUTs in the MPLD are connected to each other via the plurality of address lines, such an erroneous operation that external noise is written to the memory cells via a word selection signal may easily occur. Therefore, the ATD circuit included in the MLUT allows writing to the memory cells only when the address is changed, thereby preventing the erroneous operation of writing the external noise.

6. Method for Generating Truth Table Data

In the reconfigurable logic device, the MLUT realizes a function of the logic element and/or the connection element when the truth table data is generated by an information processing apparatus executing a software program for a logical configuration and the truth table data is stored in the MLUT.

Figure 18:
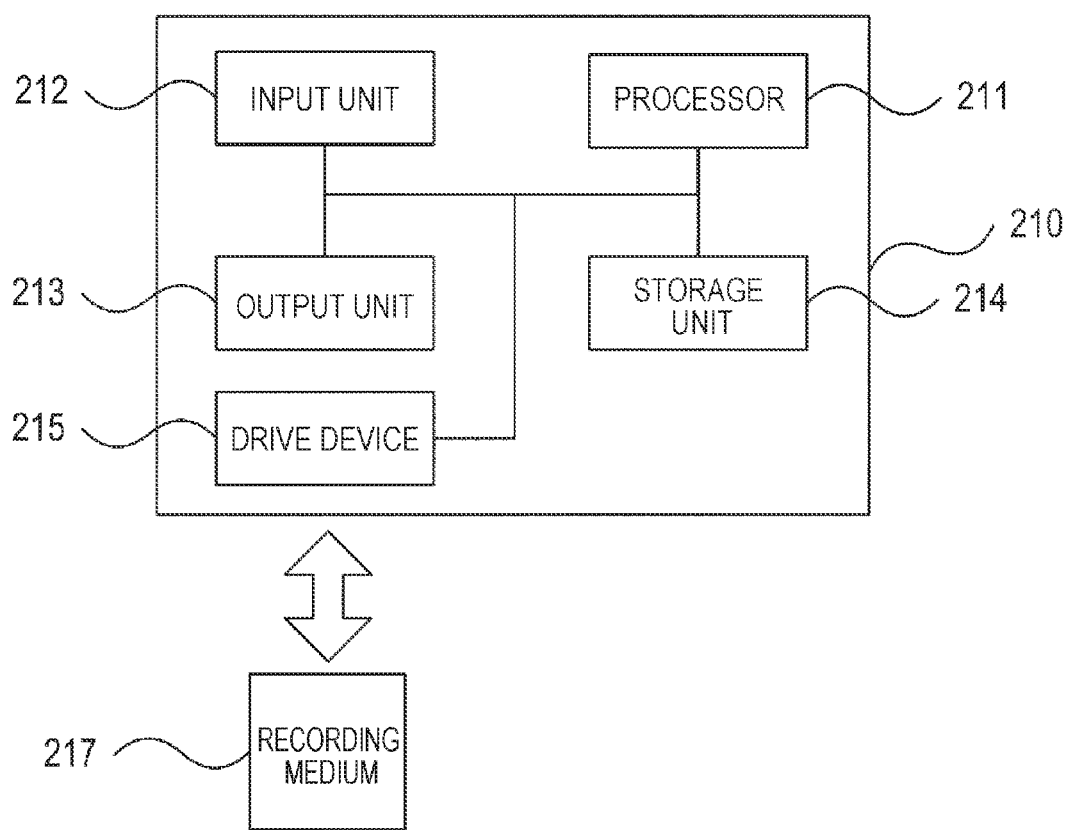
FIG. 18 is a diagram illustrating a hardware configuration of an information processing apparatus.

FIG. 18 is a diagram illustrating an example of a hardware configuration of an information processing apparatus. An information processing apparatus 210 has a processor 211, an input unit 212, an output unit 213, a storage unit 214 and a drive device 215. The processor 211 allows the storage unit 214 to store software for arrangement and wiring, a circuit description language such as a C-language description or a hardware description language (HDL) for designing an integrated circuit, which are inputted to the input unit 212, and truth table data generated by executing the software described above. Further, the processor 211 executes the software for arrangement and wiring to subject the circuit description stored in the storage unit 214 to arrangement and wiring processing as described below to output the truth table data to the output unit 213. The reconfigurable logic device 20 (not shown in FIG. 18) can be connected to the output unit 213, and the truth table data generated by the logical configuration processing executed by the processor 211 is written to the reconfigurable logic device 20 via the output unit 213. The output unit 213 may be connected to an external network. In this case, the software program for the logical configuration is transmitted and received via the network. The drive device 215 is a device reading and writing a storage medium 217 such as a digital versatile disc (DVD) or a flash memory, for example. The drive device 215 includes a motor rotating the storage medium 217, a head reading and writing data on the storage medium 217, and others. Note that the storage medium 217 can store the program for the logical configuration, or the truth table data. The drive device 215 reads the program from the set storage medium 217. The processor 211 allows the storage unit 214 to store the program or the truth table data read by the drive device 215.

The above-described embodiments are only typical examples, the combination of the structural elements of the respective embodiments, modifications and variations are apparent to those skilled in the art, and it is obvious for those skilled in the art to make various modifications to the above-described embodiments without departing from the principles of the invention and the scope of the invention described in the claims.

REFERENCE SIGNS LIST 20 programmable logical address
MLUT

What is claimed is:

1. A reconfigurable logic device configured as a logic element or a connection element, the reconfigurable logic device comprising
a plurality of memory cell units, each storing configuration information and configured as the logic element or the connection element,
wherein each of the plurality of memory cell units includes
a pair of bit lines for logic arranged corresponding to a column of memory cells,
a word line for logic, and
an inverter unit connected to the pair of bit lines for logic, wherein the inverter unit includes
a first CMOS configured to receive an input signal from one of the pair of bit lines for logic, and including a first MOS transistor and a second MOS transistor, and
a second CMOS configured to receive an input signal from the other of the pair of bit lines for logic, and including a third MOS transistor and a fourth MOS transistor, and
wherein the inverter unit outputs a first differential signal as a set of output signals of the first MOS transistor and the third MOS transistor, and a second differential signal as a set of output signals of the second MOS transistor and the fourth MOS transistor to another memory cell unit as a data signal for logic.

2. The reconfigurable logic device according to claim 1, wherein the memory cell unit is a multi look-up-table.

3. The reconfigurable logic device according to claim 1, further comprising an address decoder for logic of a differential four-wire logic configured to receive a data signal for logic outputted from another memory cell unit as an address signal for logic.

4. The reconfigurable logic device according to claim 1, comprising an address decoder connected to the plurality of memory cell units, and configured to decode an address signal specifying any memory cell of the plurality of connected memory cell units to output a word line selection signal selecting a word line,
wherein each of the plurality of memory cell units includes
a pair of bit lines for memory arranged corresponding to a column of memory cells, and
a word line for memory connected to the address decoder.

5. The reconfigurable logic device according to claim 4, further comprising a sense amplifier connected to the bit line for memory.

6. A control method for a reconfigurable logic device configured as a logic element or a connection element, and including a plurality of memory cell units; each storing configuration information and configured as the logic element and/or the connection element,
wherein each of the plurality of memory cell units includes
a pair of bit lines for logic arranged corresponding to a column of memory cells,
a word line for logic, and
an inverter unit connected to the pair of bit lines for logic,
wherein the inverter unit includes
a first CMOS including a first MOS transistor and a second MOS transistor, and
a second CMOS including a third MOS transistor and a fourth MOS transistor,
the control method comprising:
receiving, by the inverter unit, an input signal from one of the pair of bit lines for logic;
receiving, by the inverter unit, an input signal from the other of the pair of bit lines for logic; and
outputting, by the inverter unit, a first differential signal as a set of output signals of the first MOS transistor and the third MOS transistor, and a second differential signal as a set of output signals of the second MOS transistor and the fourth MOS transistor to another memory cell unit as a data signal for logic.

7. The control method for a reconfigurable logic device according to claim 6, wherein the memory cell unit is a multi look-up-table.

8. The control method for a reconfigurable logic device according to claim 6,
wherein the reconfigurable logic device further includes an address decoder for logic of a differential four-wire logic, and
wherein the address decoder for logic receives a data signal for logic outputted from another memory cell unit as an address signal for logic.

9. The control method for a reconfigurable logic device according to claim 6,
wherein the reconfigurable logic device includes an address decoder connected to the plurality of memory cell units,
wherein each of the plurality of memory cell units includes
a pair of bit lines for memory arranged corresponding to a column of memory cells, and
a word line for memory connected to the address decoder, and
wherein the address decoder receives an address signal specifying any memory cell of the plurality of connected memory cell units, and decodes the address signal to output a word line selection signal selecting a word line.

10. The control method for a reconfigurable logic device according to claim 9,
    wherein the reconfigurable logic device further includes a sense amplifier connected to the bit line for memory, and
    wherein the sense amplifier reads data from the bit line for memory.

11. A program for controlling a reconfigurable logic device,
    wherein the reconfigurable logic device includes a plurality of memory cell units, each storing a program composed of truth table data and configured as a logic element and/or a connection element,
    wherein each of the plurality of memory cell units includes
        a pair of bit lines for logic arranged corresponding to a column of memory cells,
        a word line for logic, and
        an inverter unit connected to the pair of bit lines for logic,
    wherein the inverter unit includes
        a first CMOS including a first MOS transistor and a second MOS transistor, and
        a second CMOS including a third MOS transistor and a fourth MOS transistor,
    wherein the inverter unit receives an input signal from one of the pair of bit lines for logic,
    wherein the inverter unit receives an input signal from the other of the pair of bit lines for logic, and
    wherein the inverter unit outputs a first differential signal as a set of output signals of the first MOS transistor and the third MOS transistor, and a second differential signal as a set of output signals of the second MOS transistor and the fourth MOS transistor to another memory cell unit as a data signal for logic,
    the program causing the memory cell unit to execute:
        processing of outputting a logical operation of a value stored in a memory cell specified by a certain address line to a data line to operate as a logic circuit; and
        processing of outputting the value stored in the memory cell specified by the certain address line to a data line connected to an address line of another storage unit to operate as a connection circuit.

12. The program according to claim 11, wherein the memory cell unit is a multi look-up-table.

13. The program according to claim 11,
    wherein the reconfigurable logic device further includes an address decoder for logic of a differential four-wire logic, and
    wherein the address decoder for logic receives a data signal for logic outputted from another memory cell unit as an address signal for logic.

14. The program according to claim 11,
    wherein the reconfigurable logic device includes an address decoder connected to the plurality of memory cell units,
    wherein each of the plurality of memory cell units includes
        a pair of bit lines for memory arranged corresponding to a column of memory cells, and
        a word line for memory connected to the address decoder, and
    wherein the address decoder receives an address signal specifying any memory cell of the plurality of connected memory cell units, and decodes the address signal to output a word line selection signal selecting a word line.

15. The program according to claim 14,
    wherein the reconfigurable logic device further includes a sense amplifier connected to the bit line for memory, and
    wherein the sense amplifier reads data from the bit line for memory.

16. A storage medium configured to store the program according to claim 11.

* * * * *